(12) United States Patent
Kim et al.

(10) Patent No.: US 9,091,421 B2
(45) Date of Patent: Jul. 28, 2015

(54) LED ARRAY MODULE AND MANUFACTURING METHOD THEREOF

(75) Inventors: Hyo Tae Kim, Seoul (KR); Gi Seok Song, Gyeonggi-do (KR); Heung Soon Kim, Gyeonggi-do (KR)

(73) Assignee: Korea Institute of Ceramic Eng. & Tech., Gyeongsangnam-Do (KR)

( * ) Notice: Subject to any disclaimer, the term of this patent is extended or adjusted under 35 U.S.C. 154(b) by 21 days.

(21) Appl. No.: 13/882,529

(22) PCT Filed: Aug. 25, 2011

(86) PCT No.: PCT/KR2011/006287
§ 371 (c)(1),
(2), (4) Date: Jun. 26, 2013

(87) PCT Pub. No.: WO2012/060545
PCT Pub. Date: May 10, 2012

(65) Prior Publication Data
US 2013/0271992 A1 Oct. 17, 2013

(30) Foreign Application Priority Data

Nov. 2, 2010 (KR) .................. 10-2010-0108099

(51) Int. Cl.
*F21S 4/00* (2006.01)
*F21V 21/00* (2006.01)
(Continued)

(52) U.S. Cl.
CPC ............ *F21V 29/004* (2013.01); *H05K 1/0203* (2013.01); *H01L 33/648* (2013.01);
(Continued)

(58) Field of Classification Search
CPC ............... H05K 1/0203; H05K 1/053; H05K 2201/064; H05K 2201/10106; H05K 2201/10969; H05K 2201/017; F21V 29/004; H01L 33/648

USPC .......... 362/249.02, 249.06, 294, 612; 445/23; 313/46; 257/99

See application file for complete search history.

(56) References Cited

U.S. PATENT DOCUMENTS 5,691,567 A    11/1997   Lo et al.
5,780,931 A *   7/1998   Shimoda et al. .............. 257/779
(Continued)

FOREIGN PATENT DOCUMENTS

KR    10-0434232    10/2004
KR    10-0629521     9/2006
(Continued)

OTHER PUBLICATIONS

International Preliminary Report on Patentability and Written Opinion of the International Searching Authority Mar. 6, 2012, with the English translation thereof dated May 8, 2013. (The references cited in the Written Opinion were cited in the IDS filed on Apr. 30, 2013.).

*Primary Examiner* — Anh Mai
*Assistant Examiner* — Glenn Zimmerman
(74) *Attorney, Agent, or Firm* — Louis Woo

(57) ABSTRACT

The present invention provides an LED array module having an improved heat-dissipating effect, and a manufacturing method thereof. To this end, an LED array module includes one or more LED unit modules, the LED unit module comprising: an LED; a heat conductive heat-dissipating slug attached to the lower portion of the LED; and leads connected to the cathode and anode of the LED, respectively, wherein the LED array module comprises: a heat-dissipating plate; a heat conductive solder layer disposed and bonded between the upper surface of the heat-dissipating plate and the lower surface of the heat-dissipating slug; a first insulating layer formed on the upper surface of the heat-dissipating plate; and array electrodes which are formed on the upper surface of the insulating layer and are electrically connected to the leads to drive the LED.

18 Claims, 3 Drawing Sheets

(51) Int. Cl.
  *F21V 29/00* (2015.01)
  *H05K 1/02* (2006.01)
  *H01L 33/64* (2010.01)
  *H05K 1/05* (2006.01)

(52) U.S. Cl.
  CPC ......... *H05K 1/053* (2013.01); *H05K 2201/017* (2013.01); *H05K 2201/064* (2013.01); *H05K 2201/10106* (2013.01); *H05K 2201/10969* (2013.01)

(56) References Cited

U.S. PATENT DOCUMENTS

| | | | |
|---|---|---|---|
| 6,498,355 B1 * | 12/2002 | Harrah et al. | 257/99 |
| 6,828,596 B2 * | 12/2004 | Steigerwald et al. | 257/99 |
| 7,821,027 B2 | 10/2010 | Shin et al. | |
| 8,624,388 B2 * | 1/2014 | Sun | 257/712 |
| 2006/0138621 A1 * | 6/2006 | Bogner et al. | 257/678 |
| 2006/0186423 A1 * | 8/2006 | Blonder et al. | 257/98 |
| 2007/0023893 A1 * | 2/2007 | Shin et al. | 257/713 |
| 2007/0035969 A1 * | 2/2007 | Kaneko et al. | 362/633 |
| 2008/0019103 A1 | 1/2008 | Kim | |
| 2008/0019133 A1 * | 1/2008 | Kim et al. | 362/294 |
| 2009/0052178 A1 * | 2/2009 | Marchl et al. | 362/249.02 |
| 2009/0073701 A1 * | 3/2009 | Lo | 362/373 |
| 2009/0283781 A1 * | 11/2009 | Chan et al. | 257/89 |
| 2010/0001294 A1 * | 1/2010 | Faller et al. | 257/79 |
| 2011/0275176 A1 * | 11/2011 | Van Veen et al. | 438/106 |
| 2012/0049236 A1 * | 3/2012 | Kamiya et al. | 257/99 |

FOREIGN PATENT DOCUMENTS

| | | |
|---|---|---|
| KR | 10-2008-0007961 | 1/2008 |
| KR | 10-0917712 | 9/2009 |
| KR | 10-0989579 | 10/2010 |
| WO | WO 2005109503 A2 * | 11/2005 |

* cited by examiner

Prior Art

LED ARRAY MODULE AND MANUFACTURING METHOD THEREOF

TECHNICAL FIELD

The present invention relates to an LED array module having an improved heat-dissipating effect. Also, the present invention relates to a manufacturing method of the LED array module.

BACKGROUND ART

Light emitting diodes (LEDs) are being spotlighted in various applications due to long life-cycle and low power consumption. Particularly, LEDs are full of promise for indoor and outdoor lightings.

In general, such an LED is manufactured in a surface mount device (SMD) structure so that the LED is directly mounted on a printed circuit board (PCB). In this structure, heat-dissipating technologies for improving life-cycle and illumination of the LED become a main issue. For example, in case of streetlamps, an LED package having a high-output power of about at least 50 W or more, preferably, about 100 W to about 150 W is required. In general, when a bonding temperature reaches a temperature of about 120° C. in a structure of the LED package, LED chips may be damaged. In case of the power package for applying high current, technologies for dissipating generated heat has become a core challenge.

FIGS. 1 and 2 illustrate heat-dissipating package structures as LED modules developed according to a related art. Particularly, FIG. 1 illustrates a heat-dissipating package structure using a metal PCB, and FIG. 2 illustrates a heat-dissipating package structure using a thermal via.

Referring to FIG. 1, an LED chip 9 is disposed on a heat slug 8 having superior thermal conductivity and then molded by a plastic package 10 including a transparent lens disposed thereon to constitute an LED package. Also, a lead 7 electrically connected to each of a cathode (not shown) and an anode (not shown) of the LED chip 9 is bonded to an array electrode 5 for operating the LED chip 9 by using a solder 6. Also, the LED package is attached to PCBs 3 and 4 constituted by a metal layer 3 for surface-mounting and an insulation layer 4 formed of an epoxy resin or ceramic. The PCB is attached to a heat sink 1 for dissipating heat. Also, the above-described attachments may be performed through a thermal interface material (TIM) 2 generally selected from the group consisting of a heat-dissipating sheet, a heat-dissipating bond, and a heat-dissipating paste.

The module structure may relatively easily dissipate heat through the heat slug 8 attached to a bottom surface of the LED chip 9. However, in case of the high-output power LED, thermal efficiency may be very low due to thermal resistance between the LED chip 9 and the heat slug 8 and thermal resistance of the TIM 2 itself. Particularly, the TIM 2 may have mere thermal conductivity of about 2 W/m·K, and maximum about 4 W/m·K in case of commercial products.

In view of this point, according to the heat-dissipating package of FIG. 2, a thermal via 11 is disposed to pass through the PCBs 3 and 4 disposed in a lower portion of the LED package to define a heat-dissipating passage between the TIM 2 disposed under the slug 8 and the TIM 2 disposed on the heat-dissipating plate 1, thereby improving a heat-dissipating effect when compared to that of the heat-dissipating package of FIG. 1.

However, in this case, a drilling process for forming an additional via hole, a via hole filling process, and a material to be filled are required to increase manufacturing costs. In addition, according to the above-described related art, heat transferred into the heat slug 8 should pass through the epoxy resin or the insulation layer 4 formed of the ceramic material, which has relatively low thermal conductivity, of the PCBs 3 and 4 so as to transfer the heat into the lower heat-dissipating plate 1. As a result, the insulation layer 3 may ultimately cause a thermal transfer bottleneck phenomenon to reduce heat-dissipating efficiency.

DISCLOSURE OF THE INVENTION

Technical Problem

The present invention provides an LED array module having an improved heat-dissipating effect and a manufacturing method thereof.

Technical Solution

According to an aspect of the present invention, there is provided an LED array module including an LED, a heat slug attached to a lower portion of the LED, and at least one LED unit module including a lead connected to each of a cathode and anode of the LED, the LED array module including: a heat-dissipating plate; a first solder layer bonded between a top surface of the heat-dissipating plate and a bottom surface of the heat slug; a first insulation layer disposed on the top surface of the heat-dissipating plate in an area except for the bonded surface between the heat-dissipating plate and the first solder layer; and an array electrode disposed on a top surface of the first insulation layer, the array electrode being electrically connected to the lead. Also, the LED array module may further include a metal thick film layer inserted between the top surface of the heat-dissipating plate and a bottom surface of the first solder layer, the metal thick film layer having thermal conductivity greater than that of the first solder layer. Also, the array electrode disposed on an area except for the area on which the lead is electrically connected to the array electrode may be covered by a second insulation layer. Also, the heat-dissipating plate may include a heat pipe therein, and the thermal-dissipating plate may be formed of at least one composition selected from the group consisting of a metal, ceramic, and composites thereof, wherein the metal may include at least one of stainless steel (SUS), aluminum (Al), and copper (Cu), and the ceramic may include at least one of AlN, $Si_3N_4$, SiC, and BN. Also, the first solder layer may be formed of at least one composition of $SnPb_{37}$, $Au_{80}Sn_{20}$, $Ag_{3.5}Sn_{96.5}$, and silver (Ag). Also, each of the first and second insulation layers may be formed of at least one composition selected from the group consisting of glass, ceramic and composites thereof. Also, the array electrode and the metal thick film layer may have the same composition, and each of the array electrode and the metal thick film layer may be formed of at least one composition of a metal and an alloy thereof, wherein the metal may include at least one of silver (Ag) and copper (Cu), and powder of the composition may include glass frit, particularly, a weight ratio of the glass frit to the powder of the composition may be about 1 to about 5.

According to another aspect of the present invention, there is provided a method of manufacturing the above-described LED array module, the method including: screen-printing and drying the first insulation layer, which is formed on an area except for an area on which the first solder layer is to be formed, on an upper portion of the heat-dissipating plate; screen-printing and drying the array electrode on an upper portion of the first insulation layer; screen-printing and drying the first solder layer on the top surface of the heat-dissipating plate; performing thermal treatment; and bonding the heat slug onto the first solder layer to mount the LED unit module and electrically connect the lead to the array electrode. Here, the thermal treatment may be performed at a temperature less than a melting point of a composition of the heat-dissipating plate.

According to further another aspect of the present invention, there is provided a method of manufacturing the above-described LED array module, the method including: screen-printing and drying the first insulation layer, which is formed on an area except for an area on which the first solder layer is to be formed, on an upper portion of the heat-dissipating plate; screen-printing and drying the array electrode and the metal thick film layer on an upper portion of the first insulation layer; screen-printing and drying the first solder layer on an upper portion of the metal thick film layer; performing thermal treatment; and bonding the heat slug onto the first solder layer to mount the LED unit module and electrically connect the lead to the array electrode. Here, the thermal treatment may be performed at a temperature less than a melting point of a composition of the heat-dissipating plate.

According to further another aspect of the present invention, there is provided a method of manufacturing the above-described LED array module, the method including: screen-printing and drying the first insulation layer, which is formed on an area except for an area on which the first solder layer is to be formed, on an upper portion of the heat-dissipating plate; screen-printing and drying the array electrode and the metal thick film layer on an upper portion of the first insulation layer; screen-printing and drying the first solder layer on an upper portion of the metal thick film layer; screen-printing and drying the second insulation layer on an upper portion of the array electrode except for the area on which the lead is electrically connected to the array electrode; performing thermal treatment; and bonding the heat slug onto the first solder layer to mount the LED unit module and electrically connect the lead to the array electrode. Here, the thermal treatment may be performed at a temperature less than a melting point of a composition of the heat-dissipating plate.

Also, in the methods of manufacturing the LED array module, a second solder layer may be screen-printed on a top surface of the array electrode while the first solder layer is screen-printed to dry the screen-printed first and second solder layers at the same time, and the electrical connection between the lead and the array electrode may be realized by connecting the lead to the second solder layer. Alternatively, the electrically connecting the lead to the array electrode may include forming a second solder layer on the array electrode to connect the second solder layer to the array electrode.

Advantageous Effects

According to the LED array module, unlike the related art, the direct thermal-dissipating passage between the heat slug disposed on the lower portion of the LED chip and the thermal-dissipating plate may be provided through the solder layer having the superior thermal conductivity without using the TIM or the PCB insulation board which has poor thermal conductivity to significantly improve the thermal-dissipating efficiency and reduce the manufacturing costs due to a simple processes thereof. Also, in the manufacturing of the LED array module, the thick film printing process may be performed to improve productivity, reduce the production costs, and realize environmental resistance due to the application of the ceramic material.

MODE FOR CARRYING OUT THE INVENTION

The present invention provides a heat-dissipating package in which a PCB insulation board that causes a thermal transfer bottleneck phenomenon in a thermal transfer passage from an LED package to a lower heat-dissipating plate is excluded to significantly improve thermal-dissipating efficiency. For this, various embodiments of the present invention will be described below with respect to corresponding drawing.

Figure 1:
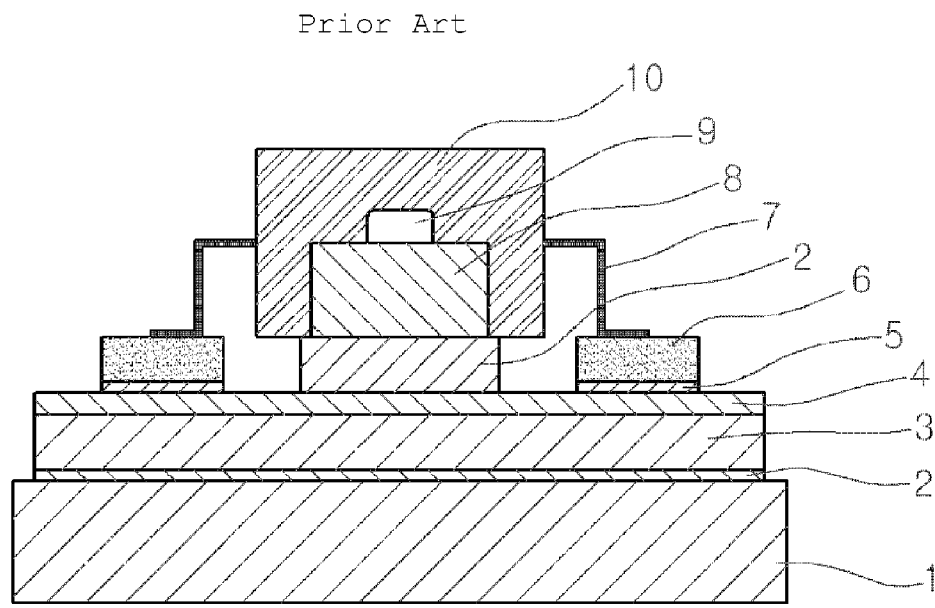
FIG. 1 is a schematic view of an LED module according to a related art.
Figure 2:
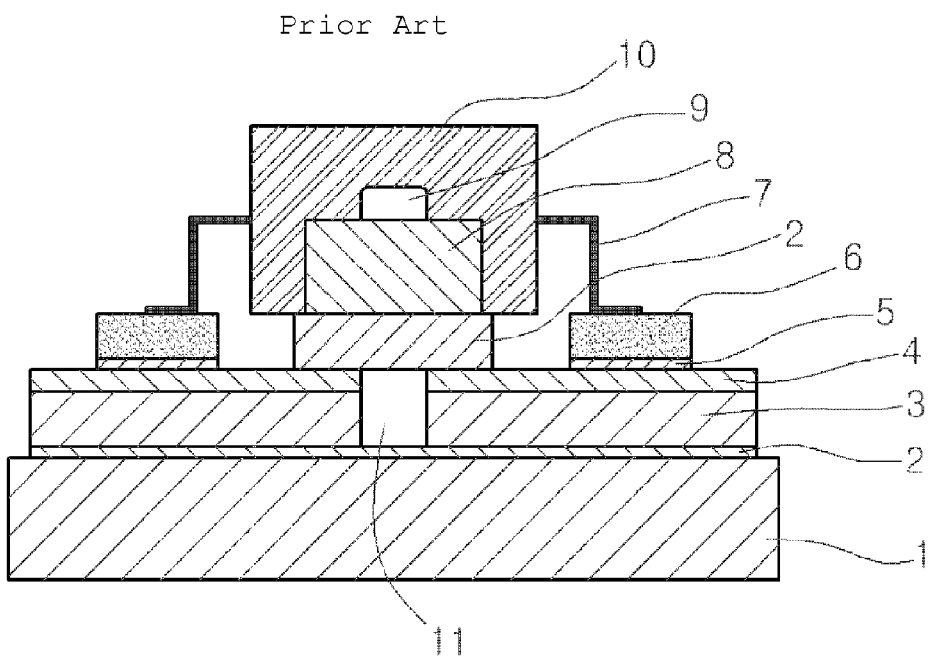
FIG. 2 is a schematic view of an LED module according to the related art.
Figure 3:
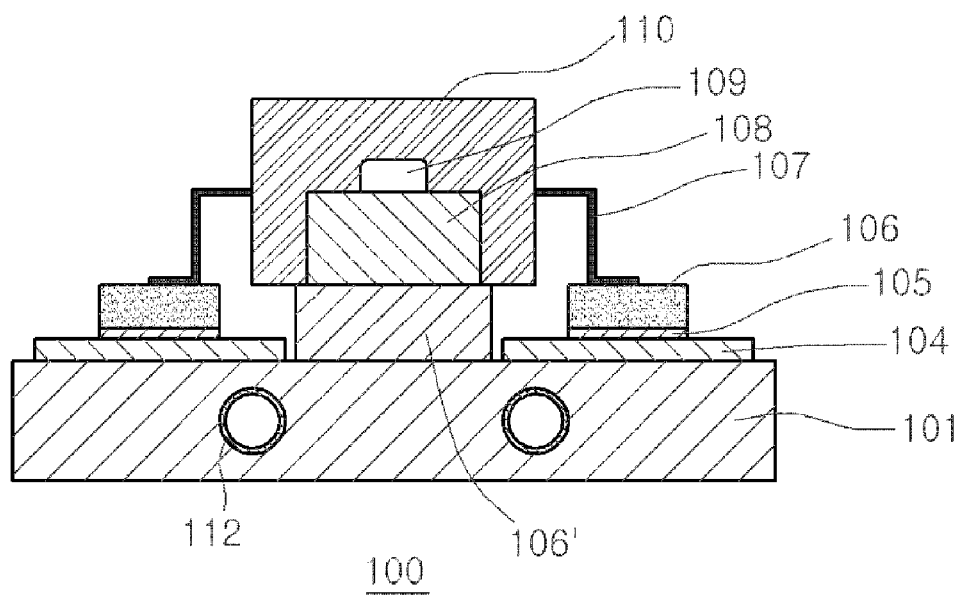
FIG. 3 is a schematic view of an LED module according to an embodiment of the present invention.

FIG. 3 is a schematic view of an LED module according to an embodiment of the present invention.

Referring to FIG. 3, in the current embodiment, an LED chip 109 is disposed on a heat slug 108 having superior thermal conductivity and molded by using a plastic package 110 including a transparent lens (not shown) that is disposed on the LED chip 109 to protect the LED chip 109 and induce emitting light in a predetermined direction. Also, a lead 107 electrically connected to each of a cathode (not shown) and an anode (not shown) of the LED chip 109 is bonded to an array electrode 105 for operating the LED chip 109 by using a solder layer 106.

The current embodiment is characterized in that a thermal interfere material (TIM) is not provided. Thus, the heat slug 108 is directly connected to a heat-dissipating plate 101 through a solder layer 106' having superior thermal conductivity to define a direct thermal-dissipating passage from the LED chip 109 to the thermal-dissipating plate 101. The thermal-dissipating plate 101 may be formed of a material selected from the group consisting of highly thermal conductive metals such as stainless steel (SUS), aluminum (Al), and copper (Cu), ceramic such as AlN, $Si_3N_4$, SiC, and BN, and composites of such metal and ceramic. In addition, the thermal-dissipating plate 101 may be formed of various materials well-known in this field. Also, the solder layers 106 and 106' may be formed of all well-known materials including $SnPb_{37}$, $Au_{80}Sn_{20}$, $Ag_{3.5}Sn_{96.5}$, and Ag. The solder layers 106 and 106' may be manufactured by all well-known manufacturing methods including a thick film screen printing method.

Also, an insulation layer 104 is disposed on the heat-dissipating plate 101 in a remaining region except for the solder layer 106' to surround the solder layer 106'. Also, an array electrode 105 is disposed on the insulation layer 104. As described above, the array electrode 105 is soldered to the lead 107 through the solder layer 106.

The insulation layer 104 may be an insulator or a dielectric and formed of one or more material selected from the group consisting of glass, ceramic and a glass-ceramic composite. In addition, the insulation layer 104 may be formed of various materials well-known in this field. In an embodiment, when aluminum (Al) having a melting point of about 660° C. is used as a material for the heat-dissipating plate 101, each of the insulation layer 104 and the array electrode 105 may have a process temperature of about 600° C. or less, particularly, about 560° C. or less, and more particularly, about 500° C. to about 560° C. Thus, the insulation layer 104 may be preferably formed of at least one of the glass-ceramic composites. Also, the insulation layer 104 may be manufactured by all well-known manufacturing methods including the thick film screen printing method.

Also, the array electrode 105 is constituted by typical conductive circuits which are suitably combined and arranged in series and parallel according to an arrangement and number of LED chips 109 that are randomly designed. The array electrode 105 may be formed of at least one of all well-known materials including silver (Ag), copper (Cu), and alloys thereof which have superior conductivity. Particularly, the array electrode 105 may be preferably formed of a material containing about 1 wt % to about 5 wt % of glass frit to metal powder. Also, the array electrode 105 may be manufactured by all well-known manufacturing methods including the thick film screen printing method.

According to the current embodiment, the direct thermal-dissipating passage between the heat slug 108 disposed on a lower portion of the LED chip 109 and the thermal-dissipating plate 101 may be defined through the solder layer 106' having the superior thermal conductivity without disposing the TIM or the insulation layer 104 to significantly improve the thermal-dissipating efficiency.

Also, the LED module 100 according to the current embodiment may be manufactured by a process of screen-printing the insulation layer 104 and a wiring layer of the array electrode 105 on the thermal-dissipating plate 101 by using paste of the above-described material powder, a process of screen-printing the paste of the above-described material powder by using a metal mask to form the solder layers 106 and 106', and a process of surface-mounting the LED chip 109 and the heat slug 108 attached to the LED chip 109 and soldering 106 the lead 107 to the array electrode 105. Here, the two solder layers 106 and 106' may be formed at the same time. Alternatively, the solder layer 106' may be formed in the process of screen-printing the paste of the above-described corresponding material powder by using the metal mask, and then, the solder layer 106 may be formed in the soldering process.

Figure 4:
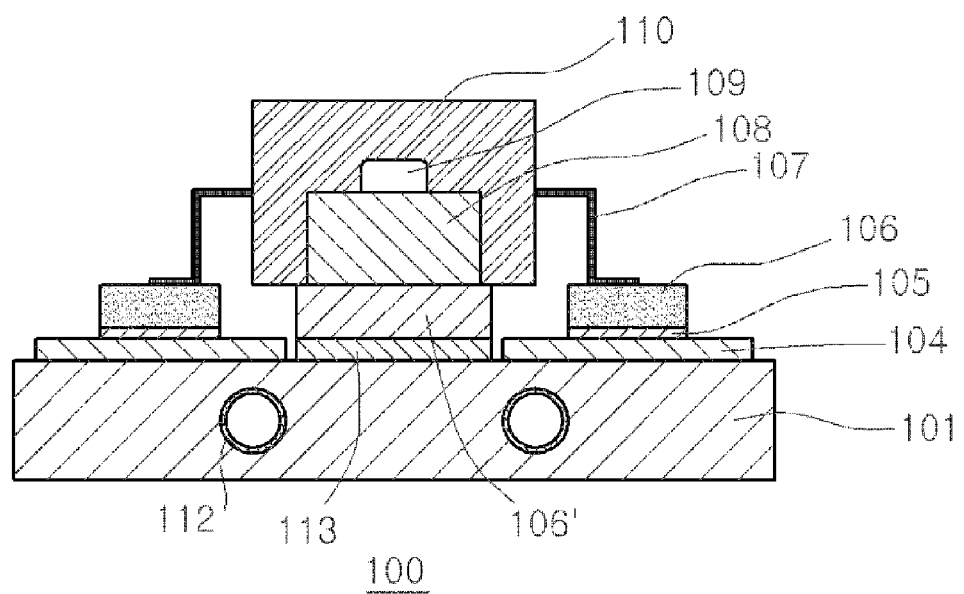
FIG. 4 is a schematic view of an LED module according to another embodiment of the present invention.

FIG. 4 is a schematic view of an LED module according to another embodiment of the present invention.

Referring to FIG. 4, this embodiment is characterized in that a predetermined metal thick film layer 113 is additionally provided in the LED thermal-dissipating package of FIG. 3. However, other components and manufacturing method are the same. The metal thick film layer 113 is disposed on a bottom surface of a solder layer 106' that is disposed on a bottom surface of a heat slug 108. Also, the metal thick film layer 113 may be formed of at least one of all well-known materials including silver (Ag), copper (Cu), and alloys thereof, like the array electrode 105 of FIG. 3. Particularly, the metal thick film layer 113 my be formed of a material containing about 1 wt % to about 5 wt % of glass frit to metal powder. That is, in a case where the solder layer 106' is formed of $SnPb_{37}$, the solder layer 106' may have thermal conductivity of about 50.9 W/m·K(@25 μm). Also, in a case where the solder layer 106' is formed of $Au_{80}Sn_{20}$, the solder layer 106' may have thermal conductivity of about 59 W/m·K. Also, in a case where the solder layer 106' is formed of $Ag_{3.5}Sn_{96.5}$ that is a Pb-free solder, the solder layer 106' may have thermal conductivity of about 33 W/m·K. On the other hand, when the metal thick film layer 113 is formed of Ag, the metal thick film layer 113 may have thermal conductivity of about 429 W/m·K, so that the metal thick film layer 113 may be attached to the solder layer 106' to further improve the thermal-dissipating efficiency. The metal thick film layer 113 may be manufactured by all well-known manufacturing methods including a thick film screen printing method. Particularly, the metal thick film layer 113 and the array electrode 105 may be screen-printed at the same time.

Figure 5:
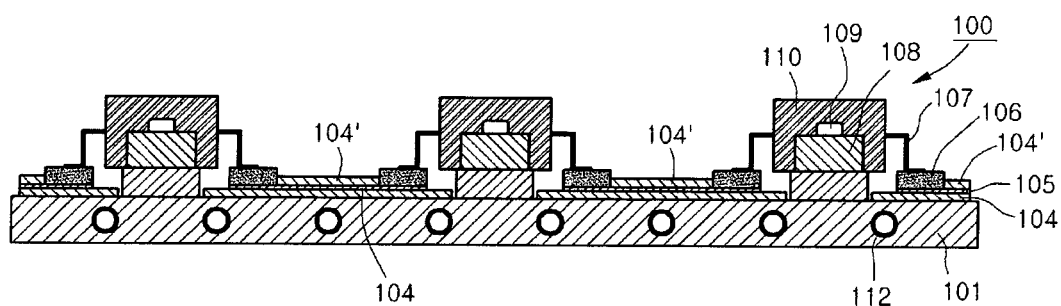
FIG. 5 is a schematic view of an LED array module according to yet another embodiment of the present invention.

FIG. 5 is a schematic view of an LED array module according to yet another embodiment of the present invention.

Referring to FIG. 5, this embodiment is characterized in that the LED unit module of FIG. 3 is repeatedly arranged in series and parallel to construct a high output LED array module for lightings. Here, the LED unit module of FIG. 3 may be replaced with the LED unit module of FIG. 4. Alternatively, the LED unit modules of FIGS. 3 and 4 may be combined together with each other.

Particularly, in the thermal-dissipating package according to current embodiment, an upper insulation layer 104' may be preferably disposed on a top surface of the array electrode 105 disposed between the unit modules 100 to secure reliability and insulating properties with respect to external environments. The upper insulation layer 104' may be formed of the same material as that of the above-described insulation layer 104.

Also, advantageously in the LED array module according to the current embodiment, the insulation layer 104, the array electrode 105, the upper insulation layer 104', and the metal thick film layer 113 may be collectively printed and dried several times through the thick film screen printing method to form a multi-layered structure, and then, a thermal treatment process may be performed once. Thereafter, the LED chip 109 and the heat slug 108 attached to the LED chip 109 may be surface-mounted and soldered to manufacture the LED array module.

It should be construed that foregoing general illustrations and following detailed descriptions are exemplified, and also it will be understood by those skilled in the art that various modifications, changes, and additions in form and details may be made therein without departing from the spirit and scope of the invention as defined by the appended claims.

For example, in the embodiments described with reference to FIGS. 3 to 5, heat pipes (reference numeral "112" in FIGS. 3 to 5) that serve as a plurality of micro passages may be disposed within the heat-dissipating plate 101. A working fluid such as water, alcohol, or inert liquid may be saturated within the heat pipes in a liquid or gaseous state. The flow between a condensing and an evaporating parts is formed due to a pressure difference between gases and a surface tension of a liquid so that a thermal transfer may be accomplished without using a separate power to significantly improve the thermal-dissipating efficiency. Also, in another embodiment, a well-known cooling water circulation device may be additionally provided in the heat pipes so that the cooling water may be circulated to double the thermal dissipation.

The invention claimed is:
1. A method of manufacturing an LED array module comprising an LED, a heat slug attached to a lower portion of the LED, and at least one LED unit module comprising a lead connected to each of a cathode and anode of the LED, the LED array module including:
a heat-dissipating plate;
a first solder layer bonded between a top surface of the heat-dissipating plate and a bottom surface of the heat slug;

a first insulation layer disposed on the top surface of the heat-dissipating plate in an area except for the bonded surface between the heat-dissipating plate and the first solder layer; and an array electrode disposed on a top surface of the first insulation layer, the array electrode being electrically connected to the lead;

the method comprising:

screen-printing and drying the first insulation layer, which is formed on an area except for an area on which the first solder layer is to be formed, on an upper portion of the heat-dissipating plate;

screen-printing and drying the array electrode on an upper portion of the first insulation layer;

screen-printing and drying the first solder layer on the top surface of the heat-dissipating plate;

performing thermal treatment; and bonding the heat slug onto the first solder layer to mount the LED unit module and electrically connect the lead to the array electrode.

2. A method of manufacturing an LED array module comprising an LED, a heat slug attached to a lower portion of the LED, and at least one LED unit module comprising a lead connected to each of a cathode and anode of the LED, the LED array module including:

a heat-dissipating plate;

a first solder layer bonded between a top surface of the heat-dissipating plate and a bottom surface of the heat slug;

a first insulation layer disposed on the top surface of the heat-dissipating plate in an area except for the bonded surface between the heat-dissipating plate and the first solder layer;

an array electrode disposed on a top surface of the first insulation layer, the array electrode being electrically connected to the lead; and a metal thick film layer inserted between the top surface of the heat-dissipating plate and a bottom surface of the first solder layer, the metal thick film layer having thermal conductivity greater than that of the first solder layer;

the method comprising:

screen-printing and drying the first insulation layer, which is formed on an area except for an area on which the first solder layer is to be formed, on an upper portion of the heat-dissipating plate;

screen-printing and drying the array electrode and the metal thick film layer on an upper portion of the first insulation layer;

screen-printing and drying the first solder layer on an upper portion of the metal thick film layer;

performing thermal treatment; and bonding the heat slug onto the first solder layer to mount the LED unit module and electrically connect the lead to the array electrode.

3. The method of claim 1, wherein the thermal treatment is performed at a temperature less than a melting point of a composition of the heat-dissipating plate.

4. The method of claim 2, wherein the thermal treatment is performed at a temperature less than a melting point of a composition of the heat-dissipating plate.

5. The method of claim 3, wherein the composition of the heat-dissipating plate comprises aluminum (Al), and the thermal treatment is performed at a temperature of about 600° C. or less.

6. The method of claim 4, wherein the composition of the heat-dissipating plate comprises aluminum (Al), and the thermal treatment is performed at a temperature of about 600° C. or less.

7. The method of claim 1, wherein a second solder layer is screen-printed on a top surface of the array electrode while the first solder layer is screen-printed to dry the screen-printed first and second solder layers at the same time, and the electrical connection between the lead and the array electrode is realized by connecting the lead to the second solder layer.

8. The method of claim 2, wherein a second solder layer is screen-printed on a top surface of the array electrode while the first solder layer is screen-printed to dry the screen-printed first and second solder layers at the same time, and the electrical connection between the lead and the array electrode is realized by connecting the lead to the second solder layer.

9. The method of claim 1, wherein the electrically connecting the lead to the array electrode comprises forming a second solder layer on the array electrode to connect the second solder layer to the array electrode.

10. The method of claim 2, wherein the electrically connecting the lead to the array electrode comprises forming a second solder layer on the array electrode to connect the second solder layer to the array electrode.

11. The method of claim 1, wherein the array electrode disposed on an area except for the area on which the lead is electrically connected to the array electrode is covered by a second insulation layer.

12. The method of claim 1, wherein the thermal-dissipating plate is formed of at least one composition selected from the group consisting of a metal, ceramic, and composites thereof, wherein the metal comprises at least one of stainless steel (SUS), aluminum (Al), and copper (Cu), and the ceramic comprises at least one of AlN, $Si_3N_4$, SiC, and BN.

13. The method of claim 1, wherein the first solder layer is formed of at least one composition of $SnPb_{37}$, $Au_{80}Sn_{20}$, $Ag_{3.5}Sn_{96.5}$, and silver (Ag).

14. The method of claim 1, wherein the first insulation layer is formed of at least one composition selected from the group consisting of glass, ceramic and composites thereof.

15. The method of claim 1, wherein the array electrode is formed of at least one composition of a metal and an alloy thereof, wherein the metal comprises at least one of silver (Ag) and copper (Cu).

16. The method of claim 1, further comprising a second solder layer on a top surface of the array electrode, wherein the array electrode is electrically connected to the lead through the second solder layer.

17. The method of claim 16, wherein the second solder layer is formed of at least one composition of $SnPb_{37}$, $Au_{80}Sn_{20}$, $Ag_{3.5}Sn_{96.5}$, and silver (Ag).

18. The method of claim 2, wherein the metal thick film layer is formed of at least one composition of a metal and an alloy thereof, wherein the metal comprises at least one of silver (Ag) and copper (Cu).

* * * * *